(12) United States Patent
Nagatomo (10) Patent No.: US 7,078,287 B2
(45) Date of Patent: Jul. 18, 2006

(54) METHOD OF MANUFACTURING SEMICONDUCTOR DEVICE

(75) Inventor: Hiroshi Nagatomo, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 50 days.

(21) Appl. No.: 10/761,186

(22) Filed: Jan. 22, 2004

(65) Prior Publication Data
US 2005/0074941 A1    Apr. 7, 2005

(30) Foreign Application Priority Data
Oct. 2, 2003    (JP)    ............... 2003-344056

(51) Int. Cl.
H01L 21/8238    (2006.01)
(52) U.S. Cl. ............... 438/230; 257/900; 257/E21.626; 257/E21.64
(58) Field of Classification Search ............... 438/20; 257/900, E21.626, E21.64
See application file for complete search history.

(56) References Cited

U.S. PATENT DOCUMENTS

| 5,899,720 | A | 5/1999 | Mikagi | |
| 6,372,673 | B1 * | 4/2002 | Besser et al. | 438/792 |
| 6,417,056 | B1 * | 7/2002 | Quek et al. | 438/303 |
| 6,893,980 | B1 * | 5/2005 | Akasaka et al. | 438/773 |
| 2003/0181028 | A1 * | 9/2003 | Yeap et al. | 438/595 |

FOREIGN PATENT DOCUMENTS

JP    8-186085    7/1996

OTHER PUBLICATIONS

S. Wolf and R.N. Tauber, Silicon Processing for the VLSI Era, vol. 1, Second Edition, 2000, Lattice Press, pp. 438 and 483.*

* cited by examiner

Primary Examiner—Laura M. Schillinger
Assistant Examiner—Heather Doty (74) Attorney, Agent, or Firm—VolentineFrancosWhitt PLLC (57) ABSTRACT

A gate electrode is formed on a silicon substrate. First spacers are formed on side surfaces of the gate electrode. With the gate electrode and the first spacers as masks, the surface of the silicon substrate is chipped off to form steplike portions at positions adjacent to base portions of the first spacers. Second spacers are formed at the steplike portions. Silicides are formed on the silicon substrate with the first spacers and the second spacers as masks.

4 Claims, 11 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly to a method of manufacturing a MOS type semiconductor device of a salicide (self-aligned silicide) structure.

2. Description of the Related Art

One example of a MOS type semiconductor device having a salicide structure has been described in Japanese laid-open Patent No. 1996-186085.

In this type of semiconductor device, a silicide film has been selectively formed on the upper surface of a gate electrode and the surface of each diffusion layer. As a result, the resistance of the diffusion layer and the resistance of the gate electrode used as a wiring are reduced. This greatly contributes to the speeding up of the semiconductor device and an improvement in its performance. As silicides, a titanium silicide ($TiSi_2$) and a cobalt silicide ($CoSi_2$) are used.

Since the silicide on the surface of each diffusion layer is limited in its forming region by the gate electrode and spacers provided on its side surfaces, and arranged in line with the gate electrode, it is called "self-aligned silicide film, i.e., salicide film".

However, there is a fear that the silicide excessively grows in a transverse direction at a portion below each spacer and hence the end of the silicide gets excessively close to the gate electrode abnormally, thus causing a leak current between the gate and the diffusion layer upon operation of the semiconductor device.

SUMMARY OF THE INVENTION

The present invention has been made in view of the above problems. An object of the present invention is to provide a method of manufacturing a semiconductor device, which is capable of preventing a leak current developed between a gate electrode and each of diffusion layers.

According to one aspect of the present invention, there is provided a method of manufacturing a semiconductor device, comprising the following steps of:

forming a gate electrode on a silicon substrate;

forming first spacers on side surfaces of the gate electrode respectively;

chipping off the surface of the silicon substrate with the gate electrode and the first spacers as masks to thereby form steplike portions at positions adjacent to base portions of the first spacers;

forming second spacers at the steplike portions respectively; and forming suicides on the silicon substrate with the first spacers and the second spacers as masks.

According to the present invention, the steplike portions are formed on the substrate so as to adjoin the base portions of the first spacers. The second spacers are respectively formed at the steplike portions. The silicide layers are formed with the second spacers as well as the first spacers as the masks. It is therefore possible to reliably prevent a leak current developed between the gate electrode and each of diffusion layers (source/drain regions) even if the suicides slightly grow on the gate electrode side.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will be described hereinbelow with reference to the accompanying drawings.

First Embodiment

FIGS. 1 through 9 respectively show states of a semiconductor device in respective processes of a manufacturing method according to a first embodiment of the present invention. The semiconductor device includes an NMOS-FET.

Figure 1:
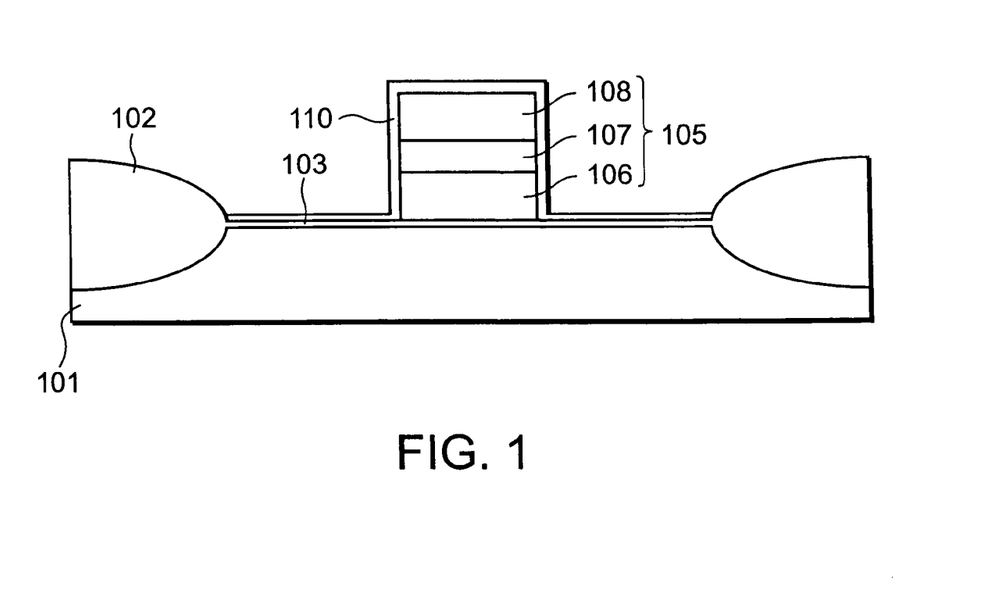
FIG. 1 is a cross-sectional view showing a state in which an oxide film 110 is formed in a method of manufacturing a semiconductor device, according to a first embodiment of the present invention.

As shown in FIG. 1, device isolation regions 102 for electrically separating respective elements from their adjacent elements are first formed on a silicon substrate 101.

An oxide film 103 having a thickness of about 3 nm is formed on such a silicon substrate 101. The oxide film serves as a gate oxide film (insulating film).

Next, a gate electrode 105 is formed in a predetermined position on the gate oxide film 103. The gate electrode 105 includes, for example, a polysilicon film 106 having a thickness of about 120 nm, a tungsten film 107 having a thickness of about 100 nm, which is located on the polysilicon film 106 and a nitride film (silicon nitride film) 108 having a thickness of about 200 nm, which is located on the tungsten film 107.

Such a gate electrode 105 is formed by sequentially forming a polysilicon layer, a tungsten layer and a nitride film on the oxide film 103 and patterning them.

Next, an oxide film 110 is formed on the upper and side surfaces of the gate electrode 105 and the surface of the silicon substrate 101. This is done by thermally oxidizing the silicon substrate 101 formed with the gate oxide film 103 and the gate electrode 105 in a dry $O_2$ atmosphere at 900° C. The thickness of the oxide film 110 is set to about 10 nm. FIG. 1 shows a state in which the oxide film 110 has been formed.

Figure 2:
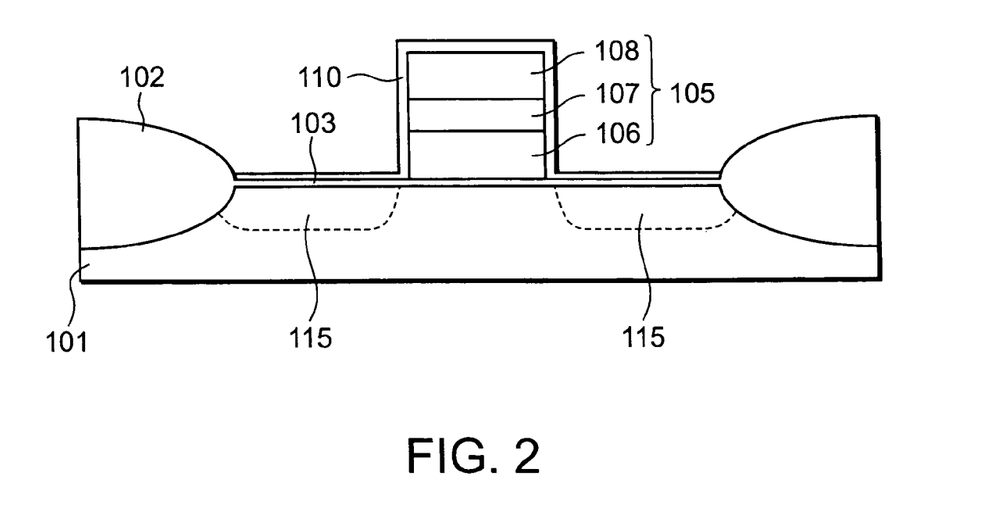
FIG. 2 is a cross-sectional view illustrating a state in which low-density diffusion layers 115 are formed in the semiconductor device manufacturing method according to the first embodiment of the present invention.

Next, as shown in FIG. 2, for example, phosphor is ion-implanted in the surface of the silicon substrate 101 under conditions of 40 keW and 7E13 $cm^{-2}$ to form $N^-$ layers (N type low-density diffusion layers) 115. Thus, the low-density diffusion layers 115 are formed on a self-alignment basis with the gate electrode 105 and the oxide film 110 formed on its side surfaces as masks.

Figure 3:
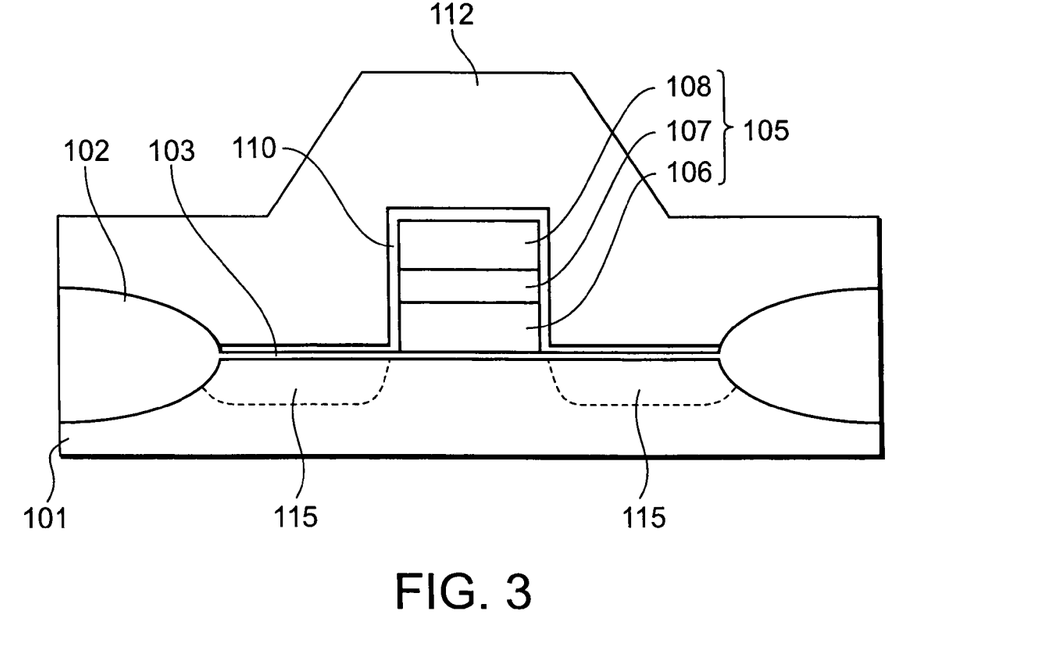
FIG. 3 is a cross-sectional view depicting a state in which an oxide film 112 is formed in the semiconductor device manufacturing method according to the first embodiment of the present invention.

Next, as shown in FIG. 3, a nitride film 112 is formed on the upper and side surfaces of the gate electrode 105 covered with the oxide film 110 and the surface of the silicon substrate 101 by an LPCVD method, for example.

Figure 4:
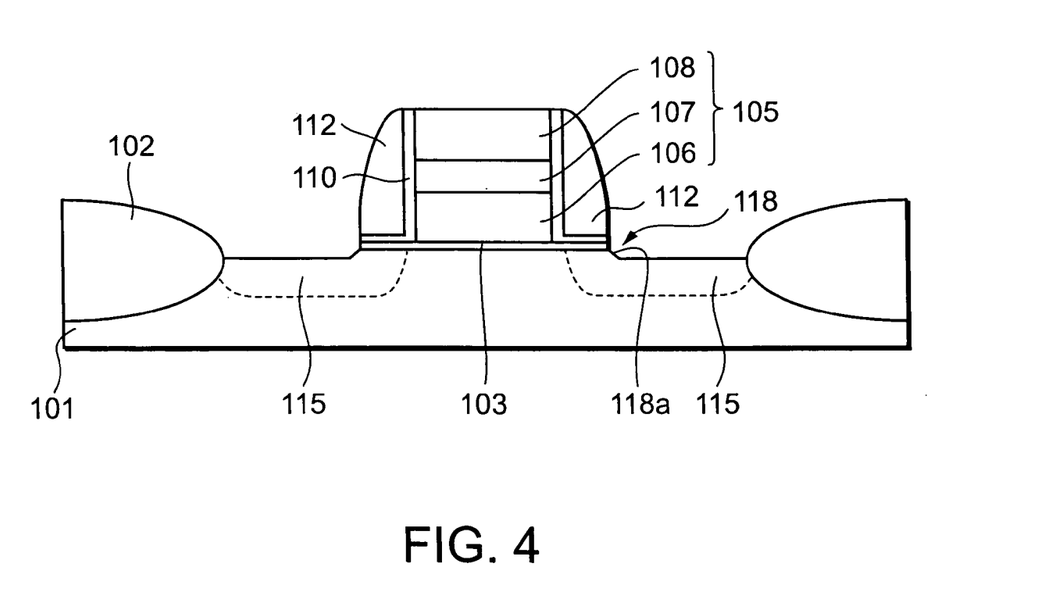
FIG. 4 is a cross-sectional view showing a state in which a substrate 101 is chipped off to form steps 118 in the semiconductor device manufacturing method according to the first embodiment of the present invention.

Next, as shown in FIG. 4, anisotropic etching is effected to remove the nitride film 112 and the oxide film 110 on the upper surface of the gate electrode 105, and the nitride film 112 and the oxide films 110 and 103 on the surface of the silicon substrate 101. On the other hand, the nitride film 112 on each side surface of the gate electrode 105 is left behind and the surface of the silicon substrate 101 is chipped off about 25 nm by overetching.

The nitride films 112 left on the side surfaces of the gate electrode 105 serve as spacers. The thickness (size in a transverse direction, i.e., direction normal to the side surface of the gate electrode 105) of each nitride film is set to about 60 nm, for example. Incidentally, each of the spacers 112 might be called "first spacer" to distinguish from a second spacer to be described later.

This anisotropic etching is done using, for example, a magnetron RIE type etching system at a lower electrode temperature of 50° C. for a processing time of 35 seconds using, for example, a processing pressure of 18 mT, an RF output of 500 W and a mixed gas of $CHF_3/Ar/O_2$ flow rates: 30/70/5 sccm.

Further, the overetching is similarly done using the magnetron RIE type etching system at a lower electrode temperature of 50° C. for a processing time of 10 seconds using, for example, a processing pressure of 18 mT, an RF output of 500 W and a mixed gas of $CH_3/Ar/O_2$ flow rates: 50/70/3 sccm to chip off the surface of the silicon substrate 101 about 25 nm and thereby to form steps (steplike portions) 118 of the silicon substrate 101 at portions adjacent to base portions of the first spacers 112. In the first embodiment, the steplike portions 118 are formed so as to have upward slanting surfaces 118a inclined toward the surface of the silicon substrate 101. An upper end of the slanting surface 118a is connected to a portion of the silicon substrate 101, which has been covered with the first spacer 112 or the like and has not been chipped off by the anisotropic etching at the position adjacent to the base portion of the first spacer 112, whereas a lower end of the slanting surface 118a is connected to the surface of a portion of the silicon substrate 101, which has been chipped off by the above etching.

Figure 5:
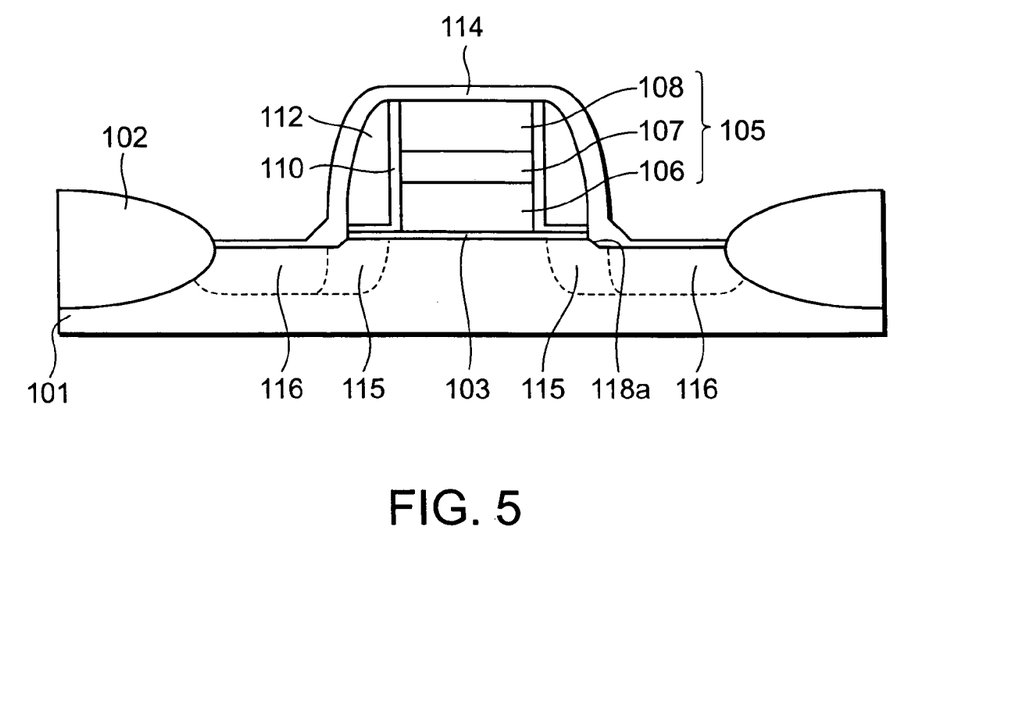
FIG. 5 is a cross-sectional view illustrating a state in which an oxide film 114 is formed and high-density diffusion layers 116 are formed in the semiconductor device manufacturing method according to the first embodiment of the present invention.
Figure 6:
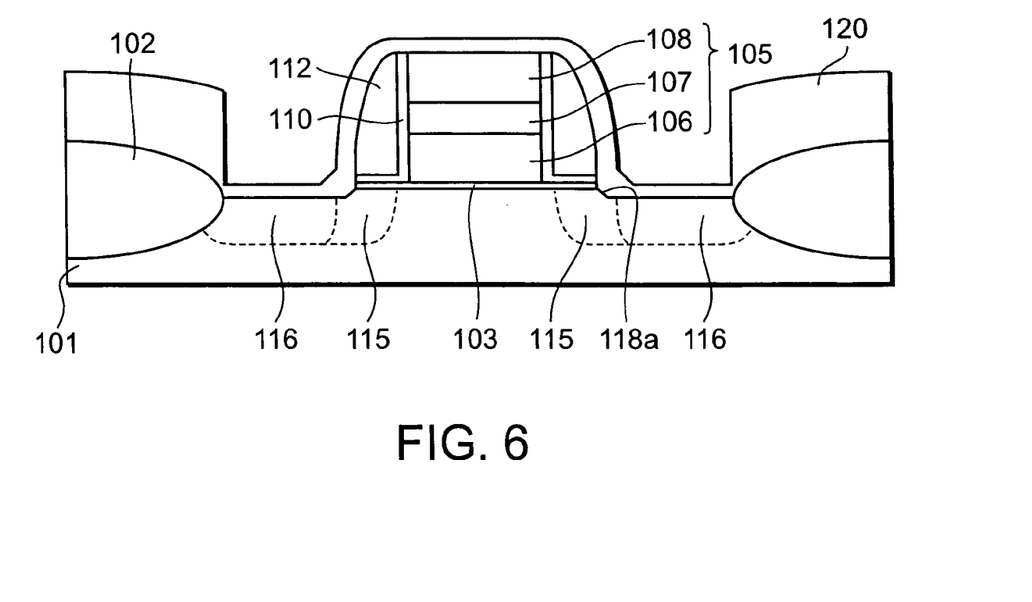
FIG. 6 is a cross-sectional view depicting a state in which a resist pattern 120 is formed in the semiconductor device manufacturing method according to the first embodiment of the present invention.
Figure 7:
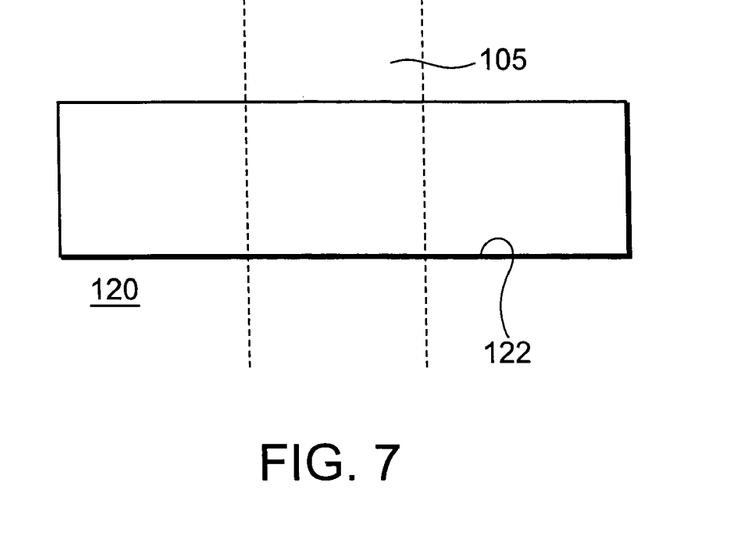
FIG. 7 is a plan view showing the state in which the resist pattern 120 is formed in the semiconductor device manufacturing method according to the first embodiment of the present invention.

Thereafter, as shown in FIG. 5, an oxide film 114 is formed on the upper surface of the gate electrode 105, the side surfaces of the first spacers (nitride film) 112 and the surface of the silicon substrate 101. This is performed by thermally oxidizing such a structure as shown in FIG. 4 by way of example in the dry $O_2$ atmosphere at 850° C. The thickness of the oxide film 114 is set to about 20 nm.

Afterwards, for example, arsenic is ion-implanted under conditions of 50 keV and 3E15 cm$^{-2}$ with the gate electrode 105, and the oxide films 110, first spacers 112 and oxide film 114 formed on the side surfaces of the gate electrode 105 as masks and then activated in N$_2$ at 1000° C. for 20 seconds to thereby form N$^+$ layers, i.e., N type high-density diffusion layers 116. The high-density diffusion layers 116 form diffusion layers, i.e., source/drain regions.

Thus, the high-density diffusion layers 116 are formed on a self-alignment basis with the gate electrode 105, and the oxide films 110, first spacers 112 and oxide film 114 formed on the side surfaces of the gate electrode 105 as masks.

Next, the oxide film 114 formed on the upper surface of the gate electrode 105, the side surfaces of the first spacers 112 and the surfaces of the diffusion layers (source/drain regions) of the silicon substrate 101 is removed.

This is performed by photolithography. That is, a resist film is first formed over the entire surface of the silicon substrate 101 including the upper surface and side surfaces of the gate electrode 105 and selectively exposed to thereby form a resist pattern 120 (see FIGS. 6 and 7). The resist pattern 120 has a substantially rectangular opening 122 corresponding to a device region (the pair of diffusion layers 116 and the upper surface of the gate electrode 105 located between these diffusion layers 116) and at the same time covers a portion other than the device region (see FIG. 7).

Figure 8:
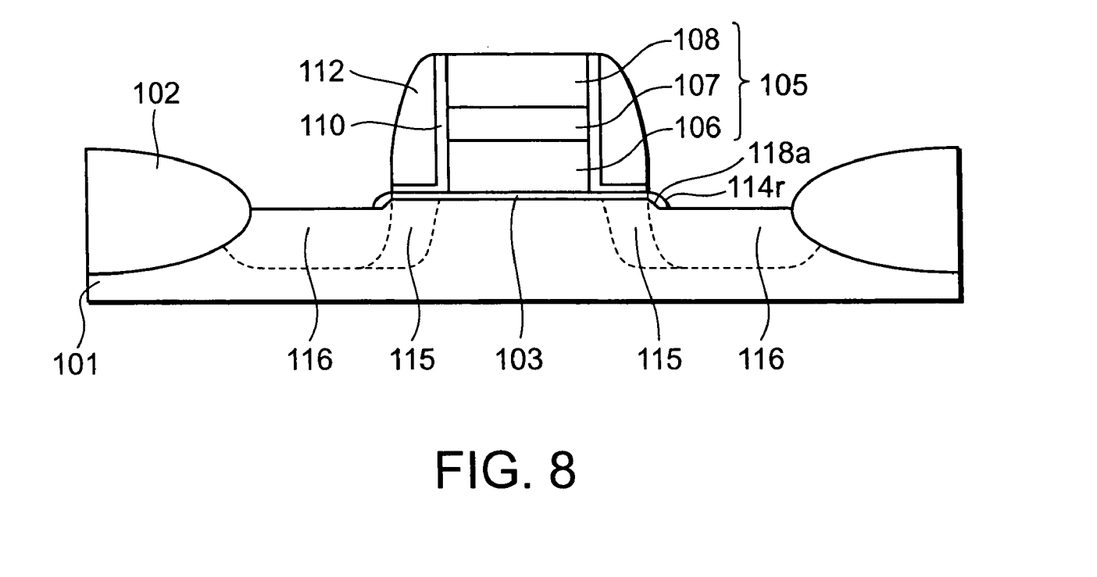
FIG. 8 is a plan view illustrating a state in which second spacers are formed in the semiconductor device manufacturing method according to the first embodiment of the present invention.

Next, the oxide film 114 located within the opening 122 of the resist pattern 120, i.e., the oxide film 114 on the device region of the silicon substrate 101 is removed by anisotropic etching (see FIG. 8). This removal is performed by the anisotropic etching. Since etching is done in accordance with the anisotropic etching, an oxide film 114r on each steplike portion 118 of the silicon substrate 101 is left behind.

This anisotropic etching is carried out by dry etching, for example. This is done by, for example, a magnetron etcher using a processing pressure of 40 mT, an RF output of 300 W and a mixed gas of C$_4$F$_8$/Ar/O$_2$ flow rates: 20/500/4 sccm.

Owing to such processing, the oxide film 114r remains at each steplike portion 118 as described above. The oxide film 114r is used as a second spacer. Incidentally, although the oxide film 114 remains even at other than the device region, it is not shown in the figure.

Next, the remaining resist pattern 120 is removed.

Next, a silicide such as a cobalt silicide is formed at portions uncovered with all of the oxide film 114 (containing the oxide film 114r on each steplike portion 118), the oxide film 110 and the first spacers 112. That is, a metal such as cobalt is deposited about 6 nm thick over the entire surface of the silicon substrate 101 and silicidized by heat treatment. The metal is heat-treated in N$_2$ for 30 seconds, for example to thereby silicidize cobalt on the diffusion layers (source/drain regions) and the gate electrode 105. The silicidized portions are designated at numerals 124 and 126 in FIG. 9.

Figure 9:
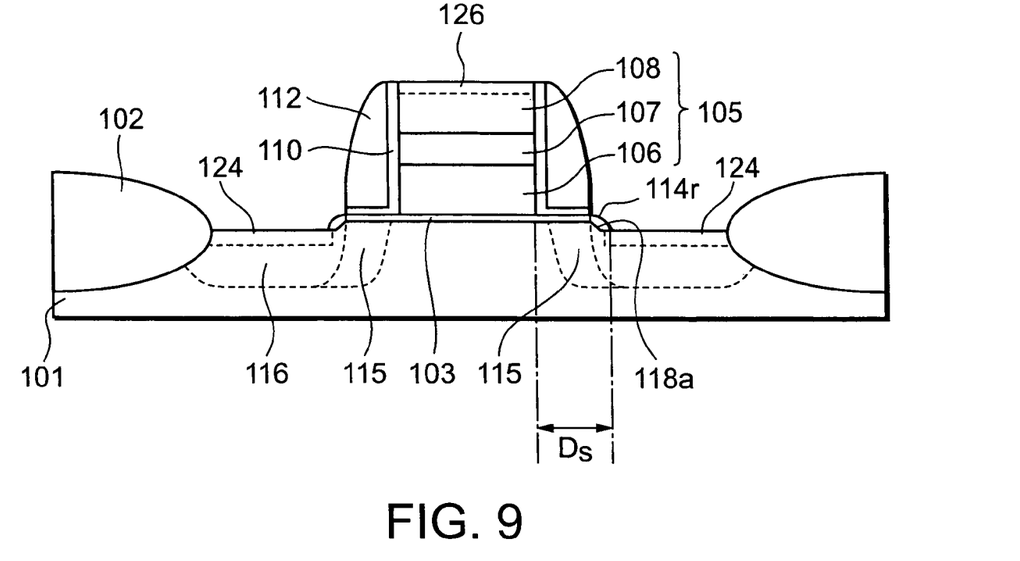
FIG. 9 is a plan view depicting a state in which silicide layers are formed in the semiconductor device manufacturing method according to the first embodiment of the present invention.

Since each of the silicide layers 124 formed at the surface portions of the diffusion layers is formed in self-alignment with the gate electrode 105, the oxide film 110 and first spacer (nitride film) 112 formed on each side surface of the gate electrode 105, and the second spacer (oxide film) 114r on each steplike portion 118, it is also called "self-aligned silicide layer, i.e., salicide layer".

Since the second spacers 114r as well as the first spacers 112 serve as masks upon formation of the salicide layers 124, an interval Ds between an end on the gate electrode 105 side, of a portion uncovered with the second spacer 114r in each diffusion layer (source/drain region) and the gate electrode 105 is relatively large. Even when each salicide layer 124 slightly grows toward the gate electrode 105 at a portion below each of the first spacer 112 and the second spacer 114r, the distance between the salicide layer 124 and the gate electrode 105 is avoided from becoming excessively small. As a result, a leak current developed between the gate electrode 105 and the salicide layer 124 (and between the gate electrode 105 and the diffusion layer 116 on which the salicide layer 124 is formed) can be reliably prevented.

Figure 10:
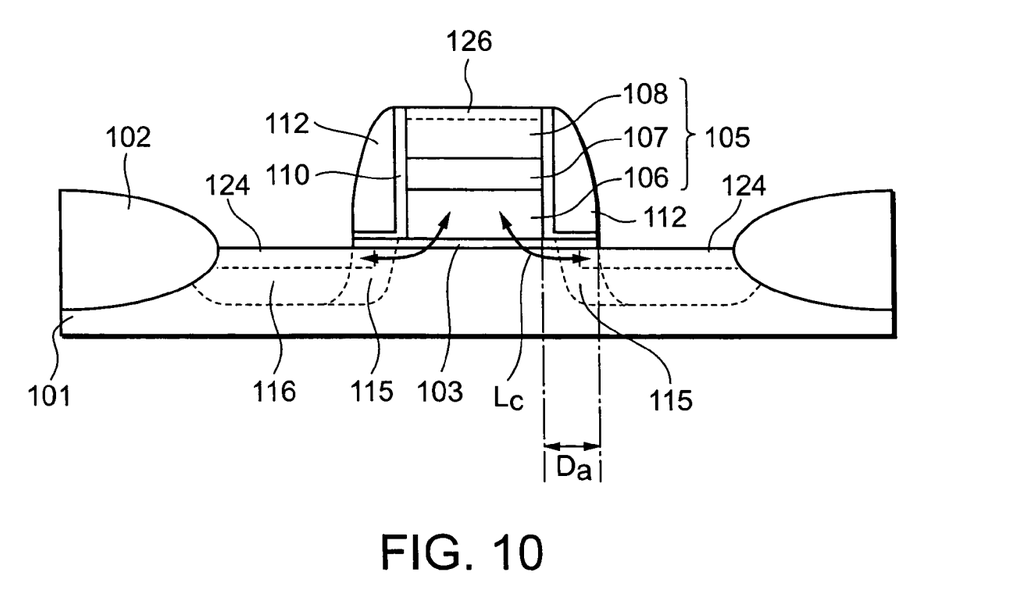
FIG. 10 is a cross-sectional view for describing a leak current between each silicide layer and a gate electrode in the semiconductor device manufacturing method according to the first embodiment of the present invention.

That is, a MOS transistor formed by a conventional method is not provided with the second spacers each formed of the oxide film 114r of FIG. 9 and has such a structure as shown in FIG. 10. Therefore, an interval Da between an end on the side closer to a gate electrode 105, of a portion uncovered with each first spacer 112 in a diffusion layer (source/drain region) is relatively small. When a salicide layer 124 grows toward the gate electrode side, the distance between the salicide layer 124 and the gate electrode 105 becomes excessively small, so that a leak current Lc has flowed so far. However, as a result of the provision of the second spacers 114r as in the above embodiment, the generation of such a leak current can be suppressed.

Second Embodiment

Figure 11:
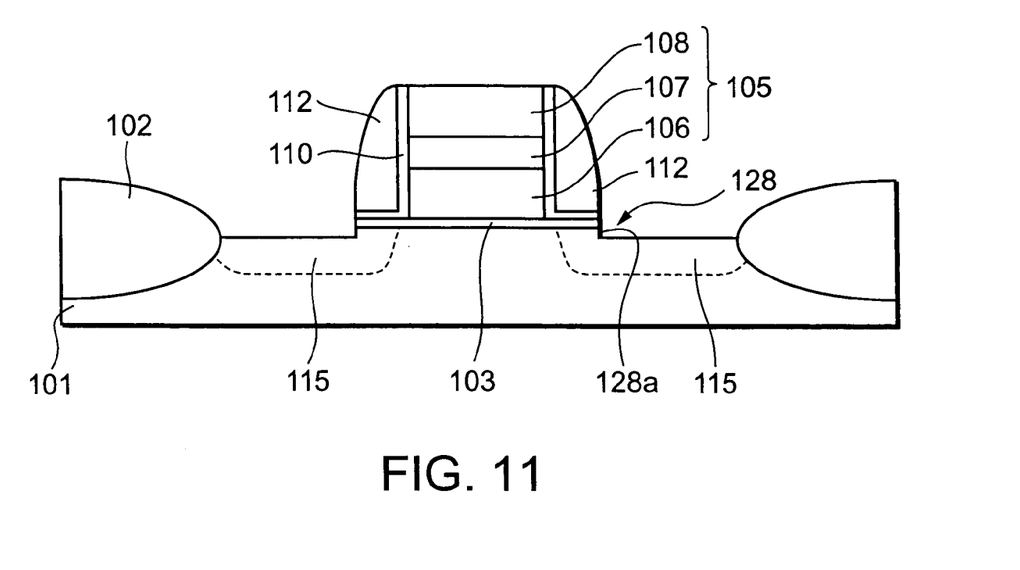
FIG. 11 is a cross-sectional view showing a state in which a substrate 101 is chipped off to form steps 128 in a method of manufacturing a semiconductor device, according to a second embodiment of the present invention.

Although the steplike portions 118 are formed so as to have the upward slanting surfaces 118a in the first embodiment, steplike portions 128 having vertical surfaces 128a may be formed as shown in FIG. 11 as an alternative to it.

In this case, the processes to be executed up to FIG. 3 are similar to those described in the first embodiment.

The structure shown in FIG. 3 is anisotropically etched to remove the nitride film 112 and the oxide film 110 lying on the upper surface of the gate electrode 105, and the nitride film 112 and oxide films 110 and 103 lying on the surface of the silicon substrate 101. On the other hand, the nitride film 112 on each side surface of the gate electrode 105 is left behind. Further, the surface of the silicon substrate 101 is chipped off about 25 nm by overetching.

The nitride films 112 left on the side surfaces of the gate electrode 105 serve as spacers (first spacers) respectively. The thickness of the nitride film 112 is set to about 60 nm, for example.

This anisotropic etching is done using, for example, a magnetron RIE type etching system at a lower electrode temperature of 50° C. for a processing time of 35 seconds using, for example, a processing pressure of 18 mT, an RF output of 500 W and a mixed gas of CHF$_3$/Ar/O$_2$ flow rates: 30/70/5 sccm.

Further, the overetching is similarly done using the magnetron RIE type etching system at a lower electrode temperature of 50° C. for a processing time of 7 seconds using, for example, a processing pressure of 18 mT, an RF output of 500 W and a mixed gas of CH$_3$/Ar/O$_2$ flow rates: 50/70/3 sccm to chip off the surface of the silicon substrate 101 about 25 nm and thereby to form steps (steplike portions) 128 at positions adjacent to base portions of the first spacers 112. In the present embodiment, the steplike portions 128 are formed so as to have surfaces 128a normal to the surface of the silicon substrate 101. The vertical surface 128a is vertical to the direction (horizontal direction in the figure) of the length of a gate. An upper end of the vertical surface 128a is connected to a portion of the silicon substrate 101, which has been covered with the first spacer 112 or the like and has not been chipped off by the anisotropic etching, at the position adjacent to the base portion of the first spacer 112, whereas a lower end of the vertical surface 128a is connected to the surface of the portion of the silicon substrate 101, which has been chipped off by the above etching.

Figure 12:
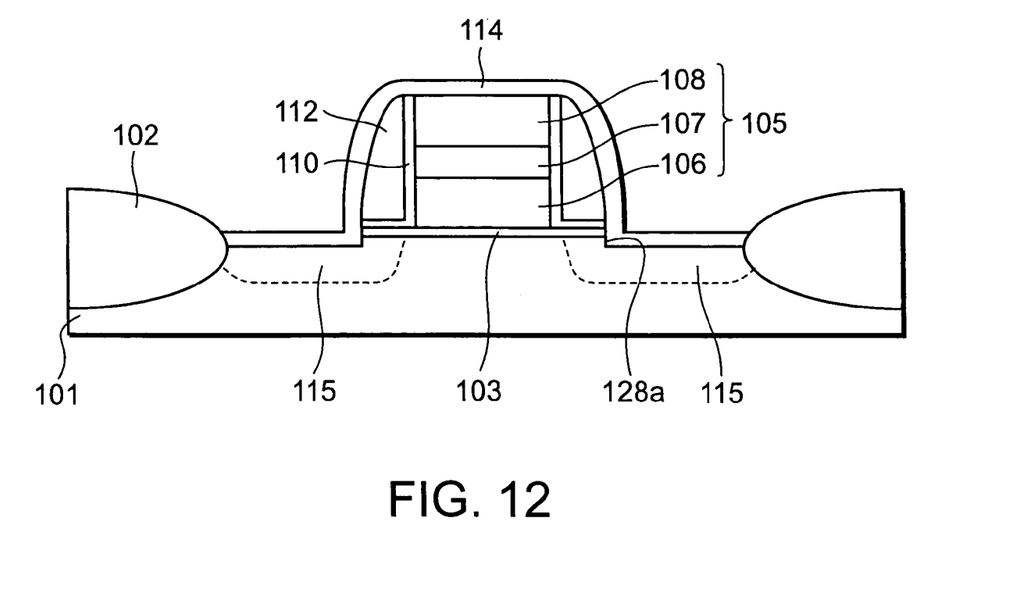
FIG. 12 is a cross-sectional view illustrating a state in which an oxide film 114 is formed and high-density diffusion layers 116 are formed in the semiconductor device manufacturing method according to the second embodiment of the present invention.

Thereafter, as shown in FIG. 12, an oxide film 114 having a thickness of about 20 nm is formed on the upper surface of the gate electrode 105, the side surfaces of the first spacers 112 and the surface of the silicon substrate 101 in a manner similar to the first embodiment.

Afterwards, high-density diffusion layers 116 each of which constitutes a source/drain region, are formed by ion-implantation or the like in a manner similar to the first embodiment.

Next, the oxide film 114 formed on the upper surface of the gate electrode 105, the side surfaces of the first spacers 112 and the surface of each diffusion layer of the silicon substrate 101 is removed in a manner similar to the first embodiment.

Figure 13:
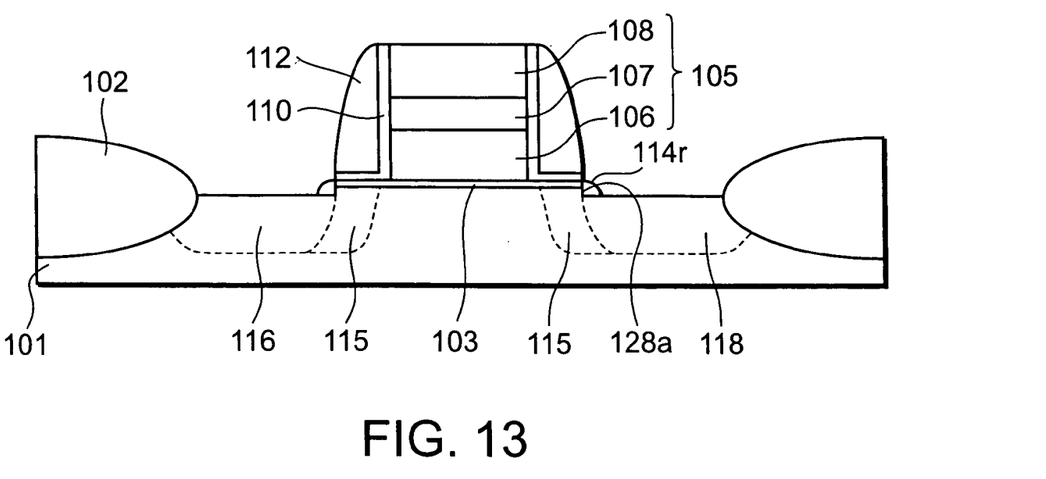
FIG. 13 is a plan view depicting a state in which second spacers are formed in the semiconductor device manufacturing method according to the second embodiment of the present invention.

Next, the oxide film 114 located within an opening 122 of a resist pattern 120, i.e., the oxide film 114 on a device region of the silicon substrate 101 is removed in a manner similar to the first embodiment (see FIG. 13). This removal is performed by anisotropic etching. Since etching is done in accordance with the anisotropic etching, an oxide film 114r on each steplike portion 128 of the silicon substrate 101 is left behind (see FIG. 13).

The oxide film 114r left at each steplike portion 128 as described above by this processing is used as a second spacer.

Next, the remaining resist pattern 120 is removed.

Figure 14:
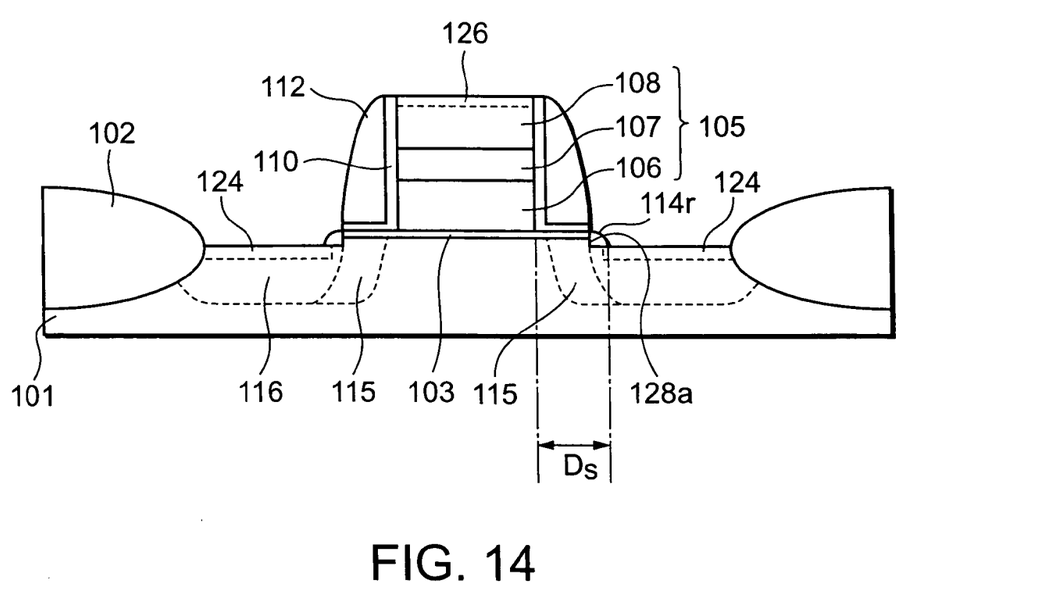
FIG. 14 is a plan view showing a state in which silicide layers are formed in the semiconductor device manufacturing method according to the second embodiment of the present invention.

Next, silicide layers 124 and 126 are formed at portions uncovered with all of the oxide film 114 (including the oxide films 114r on the steplike portions 128), the oxide films 110 and the first spacers 112 (see FIG. 14).

Since each of the silicide layers 124 formed at the surface portions of the diffusion layers is formed in self-alignment with the gate electrode 105, the oxide film 110 and first spacer 112 formed on the side surface of the gate electrode 105, and the second spacer (oxide film) 114r on each steplike portion 128, it is also called "salicide layer".

Since the second spacers 114r as well as the first spacers 112 serve as masks upon formation of the salicide layers 124, an interval Ds between an end on the gate electrode 105 side, of a portion uncovered with the second spacer 114r in each diffusion layer (source/drain region) and the gate electrode 105 is relatively large. Even when each salicide layer 124 slightly grows toward the gate electrode 105 at a portion below each of the first spacer 112 and the second spacer 114r, the distance between the salicide layer 124 and the gate electrode 105 is avoided from becoming excessively small. As a result, a leak current developed between the gate electrode 105 and the salicide layer 124 (and between the gate electrode 105 and the diffusion layer 116 on which the salicide layer 124 is formed) can be reliably prevented.

Since each of the steplike portions is constituted by the vertical surface, the oxide film at the steplike portion can be reliably left upon the anisotropic etching for removing the oxide film 114, and hence the second spacers can be reliably formed.

Further, since the second spacers are formed thicker stably because the steplike portions are constituted by the vertical surfaces, the leak current produced between the gate electrode and the diffusion layer (source/drain) due to the overgrowth of the silicide can be prevented more reliably.

Furthermore, it is possible to prevent a leak current without substantially changing a gate length.

Third Embodiment

Figure 15:
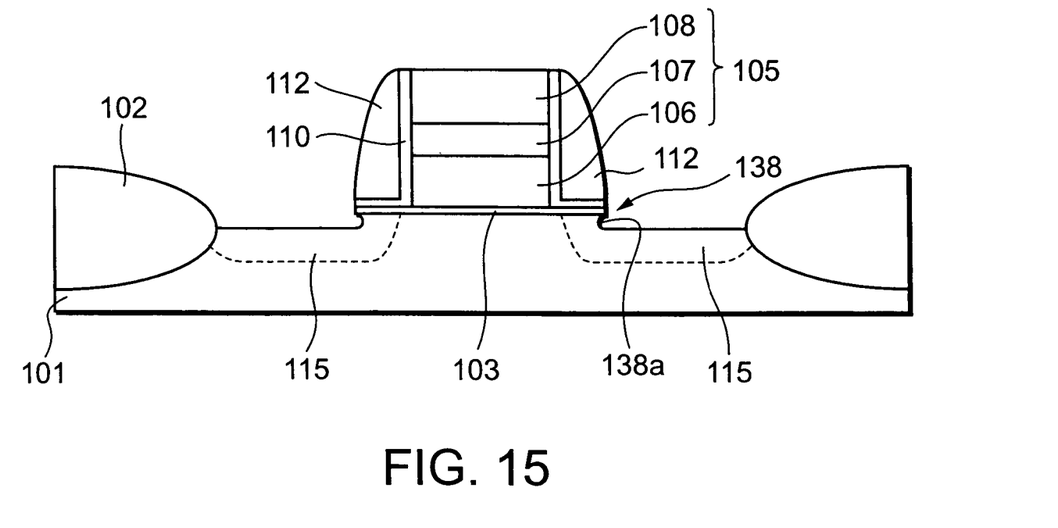
FIG. 15 is a cross-sectional view illustrating a state in which a substrate 101 is chipped off to form steps 138 in a method of manufacturing a semiconductor device according to a third embodiment of the present invention.

In the first embodiment, the steplike portions 118 have been formed so as to have the upward slanting surfaces 118a. In the second embodiment, the steplike portions 128 have been formed so as to have the vertical surfaces 128a. Steps (round steplike portions) 138 having curved surfaces 138a convex to a gate electrode may be formed as shown in FIG. 15 as an alternative to the above.

In this case, the processes to be executed up to FIG. 3 are similar to those described in the first embodiment.

The structure shown in FIG. 3 is anisotropically etched to remove the nitride film 112 and the oxide film 110 lying on the upper surface of the gate electrode 105, and the nitride film 112 and oxide films 110 and 103 lying on the surface of the silicon substrate 101. On the other hand, the nitride film 112 on each side surface of the gate electrode 105 is left behind. Further, the surface of the silicon substrate 101 is chipped off about 25 nm by using a downflow type etching system.

The nitride films 112 left on the side surfaces of the gate electrode 105 serve as spacers (first spacers) respectively. The thickness of the nitride film 112 is set to about 60 nm, for example.

This anisotropic etching is done using, for example, a magnetron RIE type etching system at a lower electrode temperature of 50° C. for a processing time of 35 seconds using, for example, a processing pressure of 18 mT, an RF output of 500 W and a mixed gas of $CHF_3/Ar/O_2$ flow rates: 30/70/5 sccm.

Thereafter, overetching is done using a microwave type chemical dry etching system at a lower electrode temperature of 25° C. for a processing time of 40 seconds using, for example, a processing pressure of 30 Pa, a microwave output of 400 W and a mixed gas of $CH_4/O_2$ flow rates: 150/150 sccm to chip off the surface of the silicon substrate 101 about 25 nm and thereby to form round steplike portions 138 at positions adjacent to base portions of the first spacers 112.

The round steplike portions are formed so as to have such curved surfaces that their vertical sections become convex to the gate electrode 105, e.g., substantially cylindrical surfaces (their vertical cross-sections are substantially arcuate surfaces) 138a. An upper end of the curved surface 138a is connected to a portion of the silicon substrate 101, which has been covered with the corresponding first spacer 112 or the like and has been not chipped off by the above anisotropic etching, at a position adjacent to the base portion of the first spacer 112. A lower end of the curved surface 138a is connected to the surface of the portion of the silicon substrate 101, which has been chipped off by the above etching.

Figure 16:
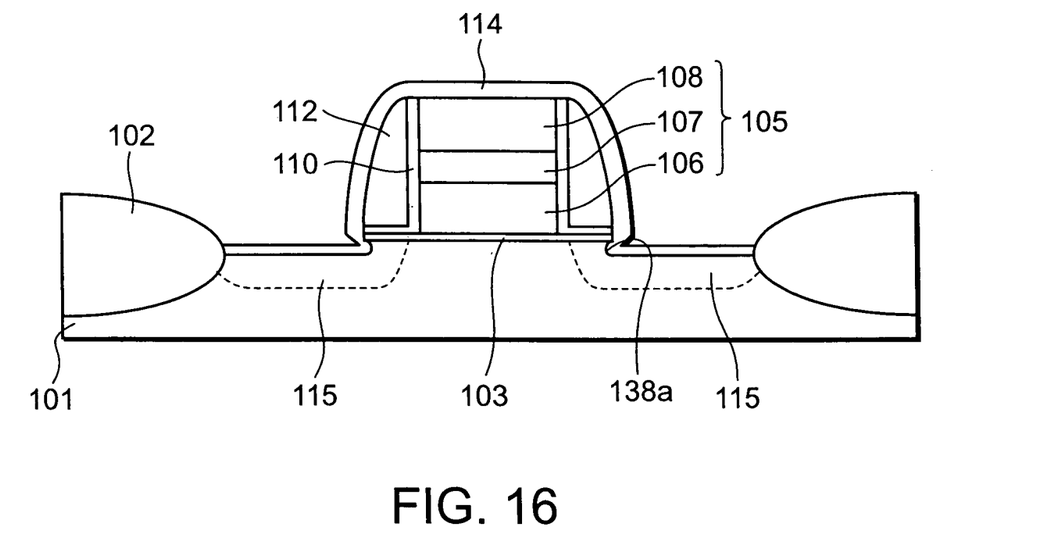
FIG. 16 is a cross-sectional view depicting a state in which an oxide film 114 is formed and high-density diffusion layers 116 are formed in the semiconductor device manufacturing method according to the third embodiment of the present invention.

Thereafter, as shown in FIG. 16, an oxide film 114 having a thickness of about 20 nm is formed on the upper surface of the gate electrode 105, the side surfaces of the first spacers 112 and the surface of the silicon substrate 101 in a manner similar to the first embodiment.

Afterwards, high-density diffusion layers 116 each of which constitutes a source/drain region, are formed by ion-implantation or the like in a manner similar to the first embodiment.

Next, the oxide film 114 formed on the upper surface of the gate electrode 105, the side surfaces of the first spacers 112 and the surface of each diffusion layer of the silicon substrate 101 is removed in a manner similar to the first embodiment.

Figure 17:
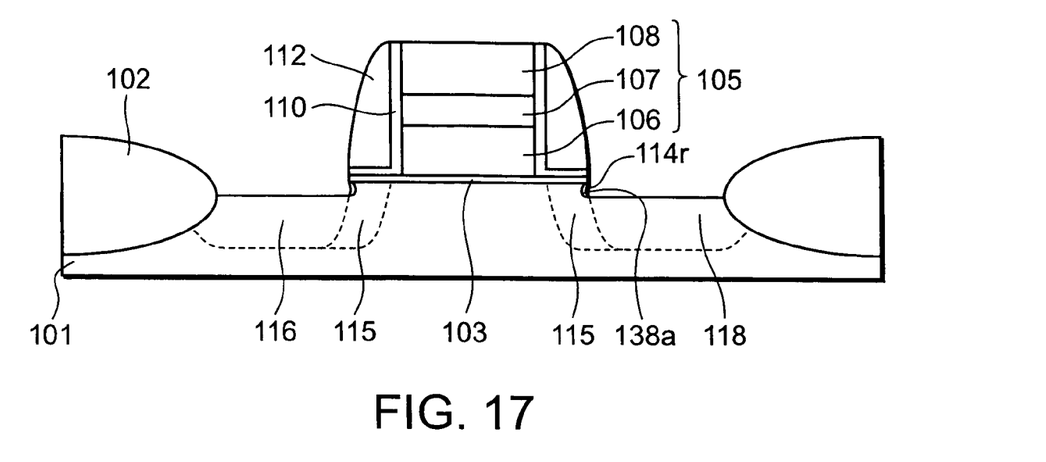
FIG. 17 is a plan view showing a state in which second spacers are formed in the semiconductor device manufacturing method according to the third embodiment of the present invention.

Next, the oxide film 114 located within an opening 122 of a resist pattern 120, i.e., the oxide film 114 on a device region of the silicon substrate 101 is removed in a manner similar to the first embodiment (see FIG. 17). Since etching is done in accordance with the anisotropic etching, an oxide film 114r on each steplike portion 138 of the silicon substrate 101 is left behind (see FIG. 17).

The oxide film 114r left at each steplike portion 138 as described above by this processing is used as a second spacer.

Next, the remaining resist pattern 120 is removed.

Figure 18A:
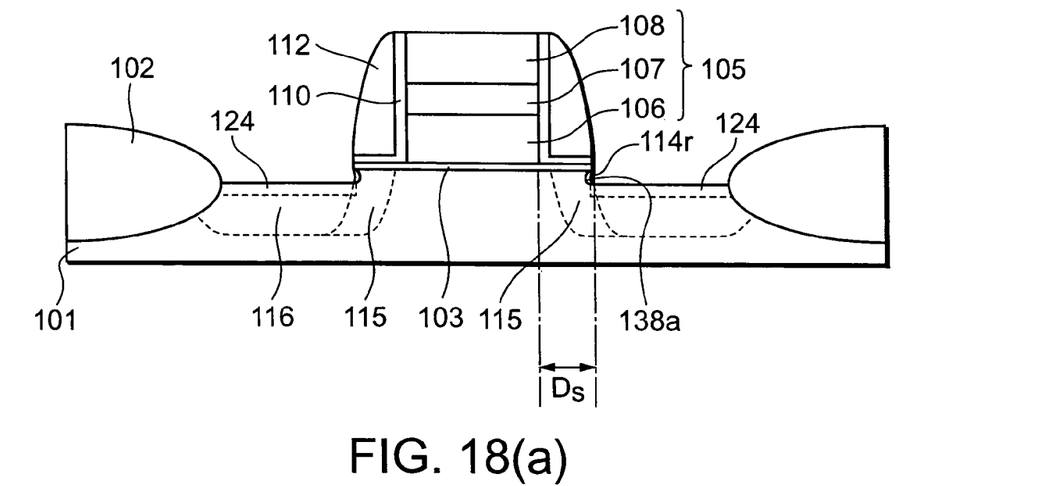
FIG. 18 is a plan view illustrating a state in which silicide layers are formed in the semiconductor device manufacturing method according to the third embodiment of the present invention.
Figure 18B:
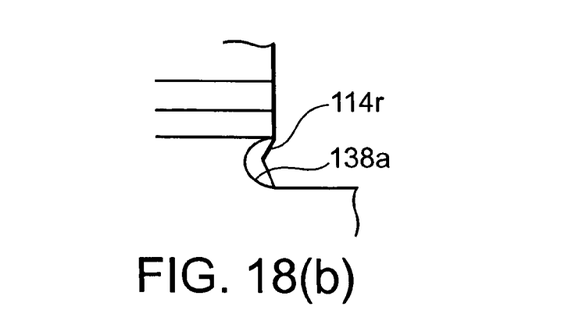

Next, silicide layers 124 and 126 are formed at portions uncovered with all of the oxide film 114 (including the oxide films 114r on the steplike portions 138), the oxide films 110 and the first spacers 112 (see FIGS. 18(a) and 18(b)). Incidentally, FIG. 18(b) shows part of the oxide film 114r of FIG. 18(a) in an enlarged form.

Since each of the silicide layers 124 formed at the surface portions of the diffusion layers is formed in self-alignment with the gate electrode 105, the oxide film 110 and first spacer 112 formed on the side surface of the gate electrode 105, and the oxide film 114r on each steplike portion 138, it is also called "salicide layer".

Since each of the second spacers 114r serves as a mask as well as the first spacers 112 upon formation of the salicide layers 124, an interval Ds between an end on the gate electrode 105 side, of a portion uncovered with the second spacer 114r in each diffusion layer (source/drain region) and the gate electrode 105 is relatively large. Even when each salicide layer 124 slightly grows toward the gate electrode 105 at a portion below each of the first spacer 112 and the second spacer 114r, the distance between the salicide layer 124 and the gate electrode 105 is avoided from becoming excessively small. As a result, a leak current developed between the gate electrode 105 and the salicide layer 124 (and between the gate electrode 105 and the diffusion layer 116 on which the salicide layer 124 is formed) can be reliably prevented.

Since each of the steplike portions is shaped in round form, the oxide film at the steplike portion can be reliably left upon the anisotropic etching for removing the oxide film 114, and hence the second spacers can be reliably formed.

Further, since the second spacers are formed thicker stably because the steplike portions are shaped in round form, the leak current produced between the gate electrode and each diffusion layer (source/drain) due to the overgrowth of the silicide can be prevented reliably.

Fourth Embodiment

Figure 19:
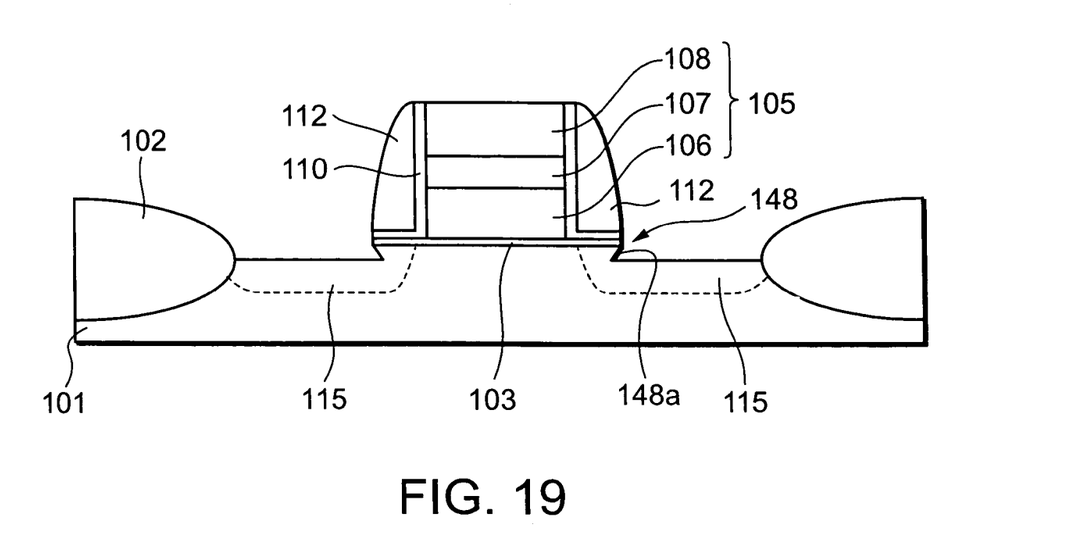
FIG. 19 is a cross-sectional view showing a state in which a substrate 101 is chipped off to form steps 148 in a method of manufacturing a semiconductor device, according to a fourth embodiment of the present invention.

In the first embodiment, the steplike portions 118 have been formed so as to have the upward slanting surfaces 118a. In the second embodiment, the steplike portions 128 have been formed so as to have the vertical surfaces 128a. In the third embodiment, the steplike portions 138 have been formed so as to have the curved surfaces 138a. As an alternative to the above, however, steps (inversedly-tapered steplike portions) 148 having downward slanting surfaces may be formed as shown in FIG. 19.

In this case, the processes to be executed up to FIG. 3 are similar to those described in the first embodiment.

The structure shown in FIG. 3 is anisotropically etched to remove the nitride film 112 and the oxide film 110 lying on the upper surface of the gate electrode 105, and the nitride film 112 and oxide films 110 and 103 lying on the surface of the silicon substrate 101. On the other hand, the nitride film 112 on each side surface of the gate electrode 105 is left behind. Further, the surface of the silicon substrate 101 is chipped off about 25 nm by using a magnetron type etching system.

The nitride films 112 left on the side surfaces of the gate electrode 105 serve as spacers (first spacers) respectively. The thickness of the nitride film 112 is set to about 60 nm, for example.

This anisotropic etching is done using, for example, a magnetron RIE type etching system at a lower electrode temperature of 50° C. for a processing time of 35 seconds using, for example, a processing pressure of 18 mT, an RF output of 500 W and a mixed gas of $CHF_3/Ar/O_2$ flow rates: 30/70/5 sccm.

Thereafter, overetching is done using an ICP type dry etching system at a lower electrode temperature of 25° C. for a processing time of 15 seconds using, for example, a processing pressure of 50 mT, an RF output of 100 W and a mixed gas of $He/O_2/HBr$ flow rates: 100/1/100 sccm to chip off the surface of the silicon substrate 101 about 25 nm and thereby to form the inversedly-tapered steplike portions 148 at positions adjacent to base portions of the first spacers 112.

The inversedly-tapered steplike portions 148 have downward slanting surfaces 148a. An upper end of the slanting surface 148a is connected to a portion of the silicon substrate 101, which has been covered with the corresponding first spacer 112 or the like and has been not chipped off by the above anisotropic etching, at a position adjacent to the base portion of the first spacer 112. A lower end of the slanting surface 148a is connected to the surface of the portion of the silicon substrate 101, which has been chipped off by the above etching.

Figure 20:
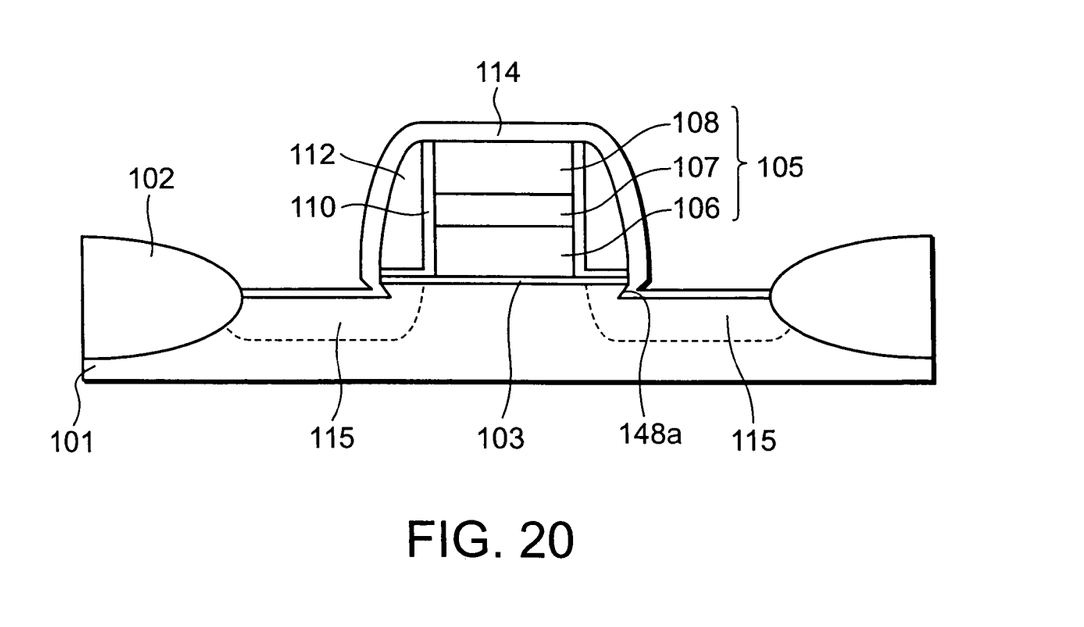
FIG. 20 is a cross-sectional view illustrating a state in which an oxide film 114 is formed and high-density diffusion layers 116 are formed in the semiconductor device manufacturing method according to the fourth embodiment of the present invention.

Thereafter, as shown in FIG. 20, an oxide film 114 having a thickness of about 20 nm is formed on the upper surface of the gate electrode 105, the side surfaces of the first spacers 112 and the surface of the silicon substrate 101 in a manner similar to the first embodiment.

Afterwards, high-density diffusion layers 116 each of which constitutes a source/drain region, are formed by ion-implantation or the like in a manner similar to the first embodiment.

Next, the oxide film 114 formed on the upper surface of the gate electrode 105, the side surfaces of the first spacers 112 and each diffusion layer (source/drain region) of the silicon substrate 101 is removed in a manner similar to the first embodiment.

Figure 21:
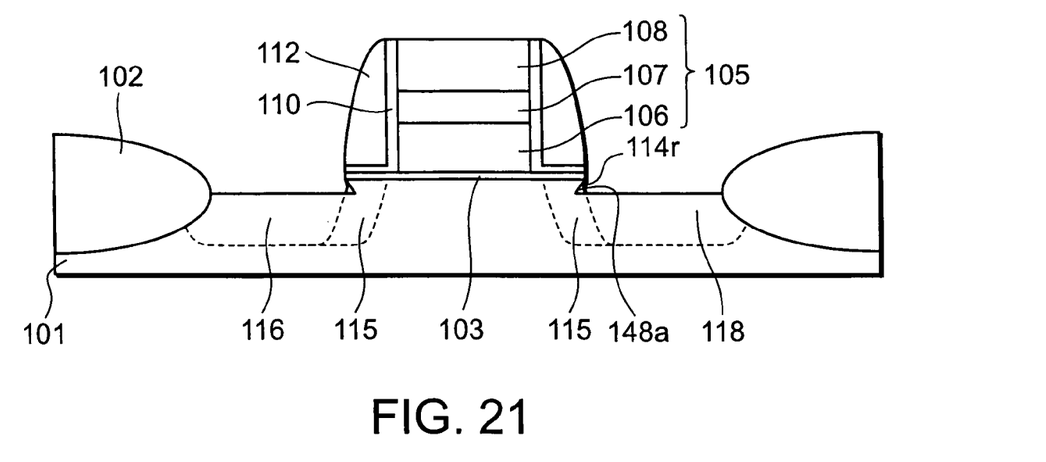
FIG. 21 is a plan view depicting a state in which second spacers are formed in the semiconductor device manufacturing method according to the fourth embodiment of the present invention.

Next, the oxide film 114 located within an opening 122 of a resist pattern 120, i.e., the oxide film 114 on a device region of the silicon substrate 101 is removed in a manner similar to the first embodiment (see FIG. 21). Since etching is done in accordance with the anisotropic etching, an oxide film 114r on each steplike portion 148 of the silicon substrate 101 is left behind (see FIG. 21).

The oxide film 114r left at each steplike portion 148 as described above by this processing is used as a second spacer.

Next, the remaining resist pattern 120 is removed.

Figure 22A:
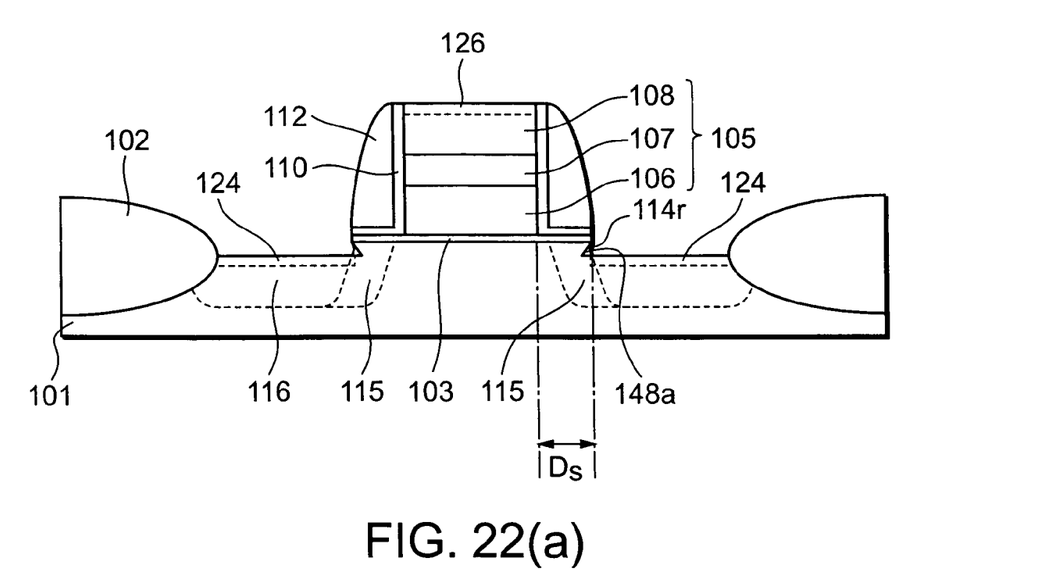
FIG. 22 is a plan view showing a state in which silicide layers are formed in the semiconductor device manufacturing method according to the fourth embodiment of the present invention.
Figure 22B:
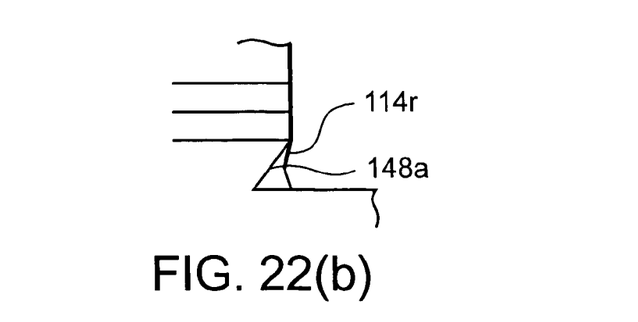

Next, silicide layers 124 and 126 are formed at portions uncovered with all of the oxide film 114 (including the oxide films 114r on the steplike portions 148), the oxide films 110 and the first spacers 112 (see FIGS. 22(a) and 22(b)). Incidentally, FIG. 22(b) shows part of the oxide film 114r of FIG. 22(a) in an enlarged form.

Since each of the silicide layers 124 formed at the surface portions of the diffusion layers is formed in self-alignment with the gate electrode 105, the oxide film 110 and first spacer 112 formed on each side surface of the gate electrode 105, and the oxide film 114r of each steplike portion 148, it is also called "salicide layer".

Since each of the second spacers 114r serves as a mask as well as the first spacers 112 upon formation of the salicide layers 124, an interval Ds between an end on the gate electrode 105 side, of a portion uncovered with the second spacer 114r in each diffusion layer (source/drain region) and the gate electrode 105 is relatively large. Even when each salicide layer 124 slightly grows toward the gate electrode 105 at a portion below each of the first spacer 112 and the second spacer 114r, the distance between the salicide layer 124 and the gate electrode 105 is avoided from becoming excessively small. As a result, a leak current developed between the gate electrode 105 and the salicide layer 124 (and between the gate electrode 105 and the diffusion layer 116 on which the salicide layer 124 is formed) can be reliably prevented.

Since each of the steplike portions is shaped in inversedly-tapered form, the oxide film at the steplike portion can be reliably left upon the anisotropic etching for removing the oxide film 114, and hence the second spacers can be reliably formed.

Further, since the second spacers are formed thicker stably because the steplike portions are shaped in inversedly-tapered form, the leak current produced between the gate electrode and each diffusion layer (source/drain) due to the overgrowth of the silicide can be prevented reliably.

Incidentally, although the cobalt silicide has been used as a silicide in the above-described embodiment, the present invention is not limited to it. The present invention is applicable even to a titanium silicide, for example.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:
   forming a gate electrode on a silicon substrate;
   forming a first spacers on respective side surfaces of the gate electrode;
   chipping off a surface of the silicon substrate using the gate electrode and the first spacers as masks, to thereby form steplike portions at positions adjacent to base portions of the first spacers;
   forming second spacers respectively at the steplike portions; and
   forming silicides on the silicon substrate using the first spacers and the second spacers as masks,
   wherein the steplike portions are respectively formed so as to have upward slanting surfaces.

2. A method of manufacturing a semiconductor device, comprising:
   forming a gate electrode on a silicon substrate;
   forming a first spacers on respective side surfaces of the gate electrode;
   chipping off a surface of the silicon substrate using the gate electrode and the first spacers as masks, to thereby form steplike portions at positions adjacent to base portions of the first spacers;
   forming second spacers respectively at the steplike portions; and
   forming silicides on the silicon substrate using the first spacers and the second spacers as masks,
   wherein the steplike portions are respectively formed so as to have curved surfaces convex to the gate electrode.

3. A method of manufacturing a semiconductor device, comprising:
   forming a gate electrode on a silicon substrate;
   forming a first spacers on respective side surfaces of the gate electrode;
   chipping off a surface of the silicon substrate using the gate electrode and the first spacers as masks, to thereby form steplike portions at positions adjacent to base portions of the first spacers;
   forming second spacers respectively at the steplike portions; and
   forming silicides on the silicon substrate using the first spacers and the second spacers as masks,
   wherein the steplike portions are respectively formed so as to have downward slanting surfaces.

4. A method of manufacturing a semiconductor device, comprising:
   forming a gate electrode on a silicon substrate;
   forming a first spacers on respective side surfaces of the gate electrode;
   chipping off a surface of the silicon substrate using the gate electrode and the first spacers as masks, to thereby form steplike portions at positions adjacent to base portions of the first spacers;
   forming second spacers respectively at the steplike portions; and
   forming silicides on the silicon substrate using the first spacers and the second spacers as masks,
   wherein said forming second spacers comprises
      forming an oxide film that covers the silicon substrate, the gate electrode, and the first spacers,
      covering portions other than a device region of the silicon substrate with a resist, and
      anisotropically etching the oxide film using the resist.

* * * * *